(12) United States Patent
Watanabe

(10) Patent No.: US 11,143,829 B2
(45) Date of Patent: Oct. 12, 2021

(54) LIGHT GUIDE BODY, OPTICAL MODULE, AND OPTICAL PATH AND OPTICAL AXIS ADJUSTMENT METHOD

(71) Applicant: SHIN-ETSU CHEMICAL CO., LTD., Tokyo (JP)

(72) Inventor: Toshiaki Watanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/327,030

(22) PCT Filed: Aug. 15, 2017

(86) PCT No.: PCT/JP2017/029332
§ 371 (c)(1),
(2) Date: Feb. 21, 2019

(87) PCT Pub. No.: WO2018/043109
PCT Pub. Date: Mar. 8, 2018

(65) Prior Publication Data
US 2020/0183102 A1    Jun. 11, 2020

(30) Foreign Application Priority Data
Sep. 2, 2016   (JP) ............... JP2016-171806

(51) Int. Cl.
*G02B 6/42*     (2006.01)
*C30B 29/06*    (2006.01)

(52) U.S. Cl.
CPC ............ *G02B 6/4227* (2013.01); *C30B 29/06* (2013.01)

(58) Field of Classification Search
CPC .................................................... G02B 6/366
See application file for complete search history.

(56) References Cited

U.S. PATENT DOCUMENTS

| 4,134,785 A * | 1/1979 | Lavigna | ................... | C30B 15/04 |
| | | | | 117/15 |
| 4,258,009 A * | 3/1981 | De Leon | ............... | C30B 13/285 |
| | | | | 117/221 |

(Continued)

FOREIGN PATENT DOCUMENTS

| CN | 101833172 A | 9/2010 |
| CN | 101833182 A | 9/2010 |

(Continued)

OTHER PUBLICATIONS

Y. Zhang, Y. He, J. Wu, X. Jiang, R. Liu, C. Qiu, X. Jiang, J. Yang, C. Tremblay, and Y. Su, "High-extinction-ratio silicon polarization beam splitter with tolerance to waveguide width and coupling length variations," Opt. Express 24, 6586-6593 (2016). (Year: 2016).*

(Continued)

*Primary Examiner* — Rhonda S Peace
(74) *Attorney, Agent, or Firm* — Oliff PLC

(57) ABSTRACT

A light guide body for optical path and optical axis adjustment, the light guide body includes a silicon single crystal having an extinction ratio of 30 dB or more. The light guide body is a light guide body having one side surface alone joined and fixed to a base. An optical module including the light guide body installed at an installation angle adjusted for optical path and optical axis adjustment between components. An optical path and optical axis adjustment method including adjusting an installation angle of the light guide body to perform the optical path and optical axis adjustment between components. It is possible to provide the light guide body which does not adversely affect polarization characteristics and can easily perform the optical path and optical axis adjustment. It is possible to provide optical module and (Continued)

the optical path and optical axis adjustment method using such a light guide body.

5 Claims, 2 Drawing Sheets

(56) References Cited

U.S. PATENT DOCUMENTS

| | | | | |
|---|---|---|---|---|
| 4,532,000 | A * | 7/1985 | Harrington | C30B 13/00 117/13 |
| 6,374,009 | B1 * | 4/2002 | Chang | G02B 6/2552 385/16 |
| 6,773,169 | B2 * | 8/2004 | Ebeling | G02B 6/4212 385/52 |
| 7,693,372 | B2 * | 4/2010 | Kaneko | G02B 6/422 385/33 |
| 8,571,076 | B2 * | 10/2013 | Kusukame | G02F 1/3775 372/21 |
| 8,837,870 | B1 * | 9/2014 | Wang | G02B 5/3083 385/11 |
| 2002/0044748 | A1 | 4/2002 | Tatoh et al. | |
| 2002/0141031 | A1 | 10/2002 | Wang et al. | |
| 2003/0002809 | A1 * | 1/2003 | Jian | G02B 6/423 385/73 |
| 2005/0089294 | A1 | 4/2005 | Gunn et al. | |
| 2015/0159298 | A1 * | 6/2015 | Yakub | C30B 13/20 117/46 |

FOREIGN PATENT DOCUMENTS

| | | |
|---|---|---|
| JP | H07-301724 A | 11/1995 |
| JP | H11-352348 A | 12/1999 |
| JP | 2000-249834 A | 9/2000 |
| JP | 2002-148492 A | 5/2002 |
| JP | 2004-272143 A | 9/2004 |
| JP | 2004-347702 A | 12/2004 |
| JP | 2007-41142 A | 2/2007 |
| JP | 2008-111863 A | 5/2008 |
| JP | 2009-020275 A | 1/2009 |
| JP | 2012-083401 A | 4/2012 |
| JP | 2015-225252 A | 12/2015 |

OTHER PUBLICATIONS

D. Taillaert, P. Bienstman, and R. Baets, "Compact efficient broadband grating coupler for silicon-on-insulator waveguides," Opt. Lett. 29, 2749-2751 (2004). (Year: 2004).*
Mar. 5, 2019 International Preliminary Report on Patentability issued in Japanese Patent Application No. PCT/JP2017/029332.
Oct. 24, 2017 International Search Report issued in International Patent Application No. PCT/JP2017/029332.
Sep. 17, 2019 Office Action issued in Japanese Patent Application Np. 2016-171806.
May 7, 2019 Office Action issued in Japanese Patent Application No. 2016-171806.
Mar. 23, 2020 Search Report issued in European Patent Application No. 17846117.4.
Apr. 3, 2020 Office Action issued in Chinese Patent Application No. 201780053254.1.
Nov. 26, 2020 Office Action issued in Chinese Patent Application No. 201780053254.1.
May 27, 2021 Office Action issued in Chinese Patent Application No. 201780053254.1.

* cited by examiner

[FIG. 1]
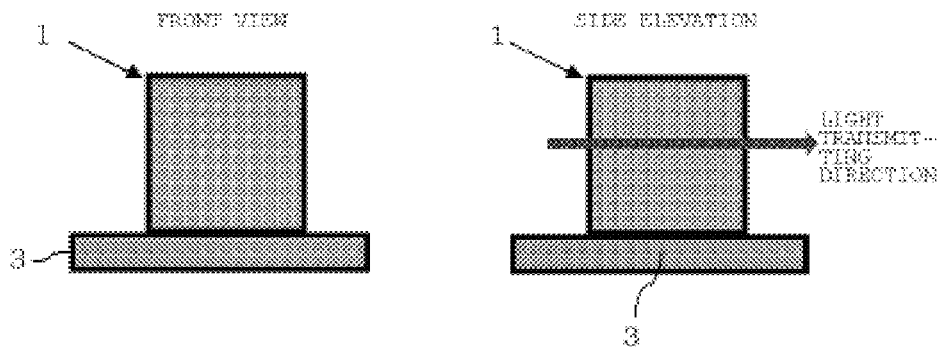
[FIG. 2A]
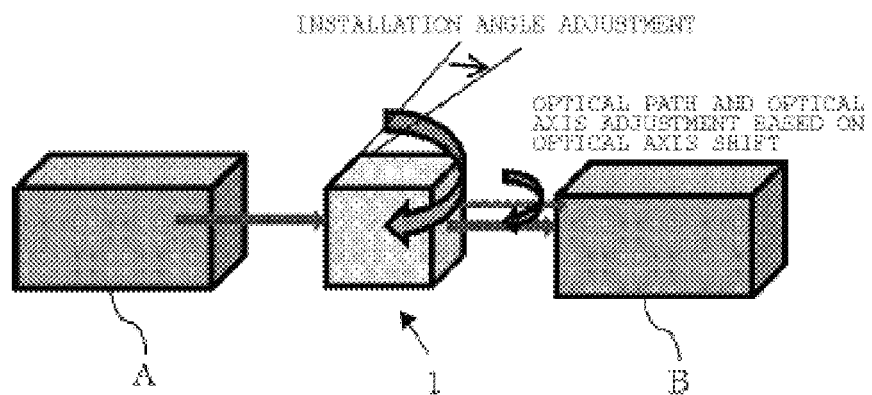
[FIG. 2B]
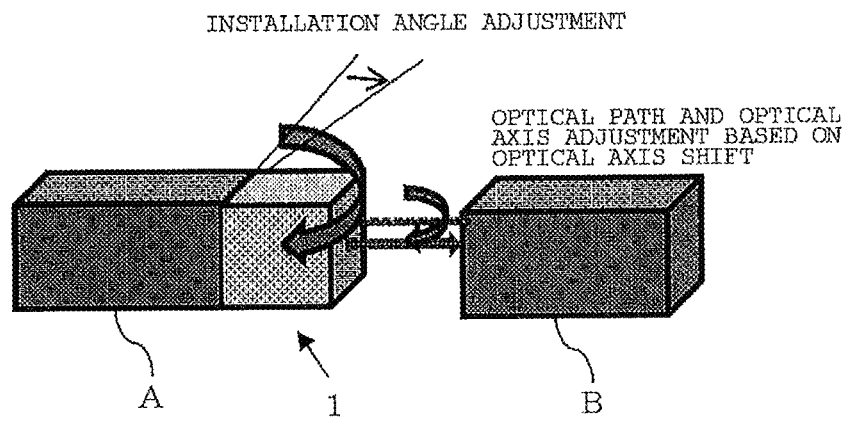

[FIG.3]
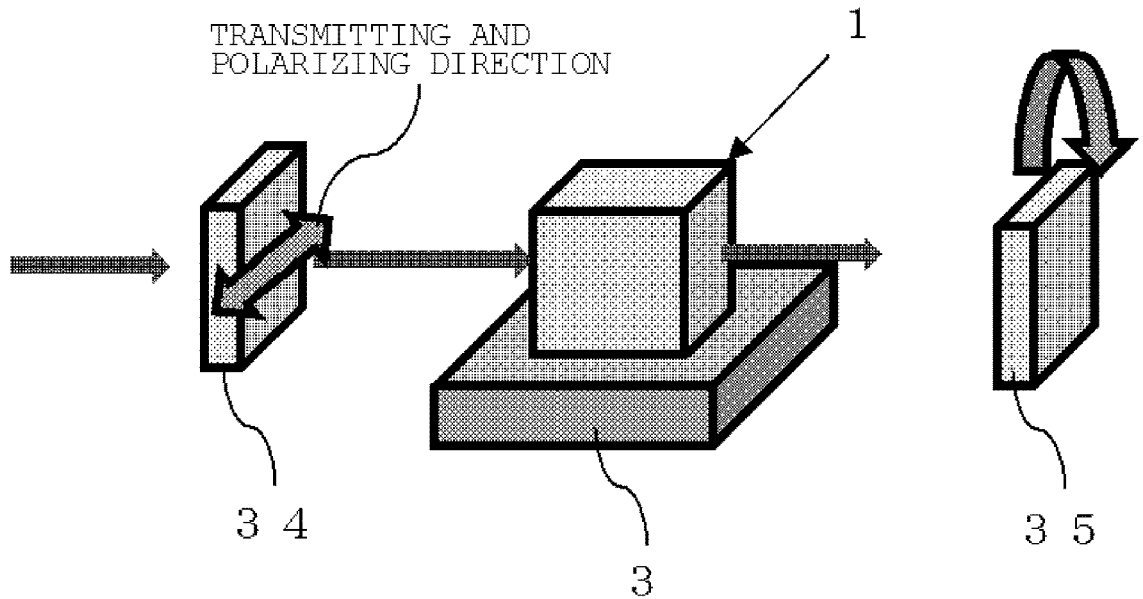
[FIG.4]
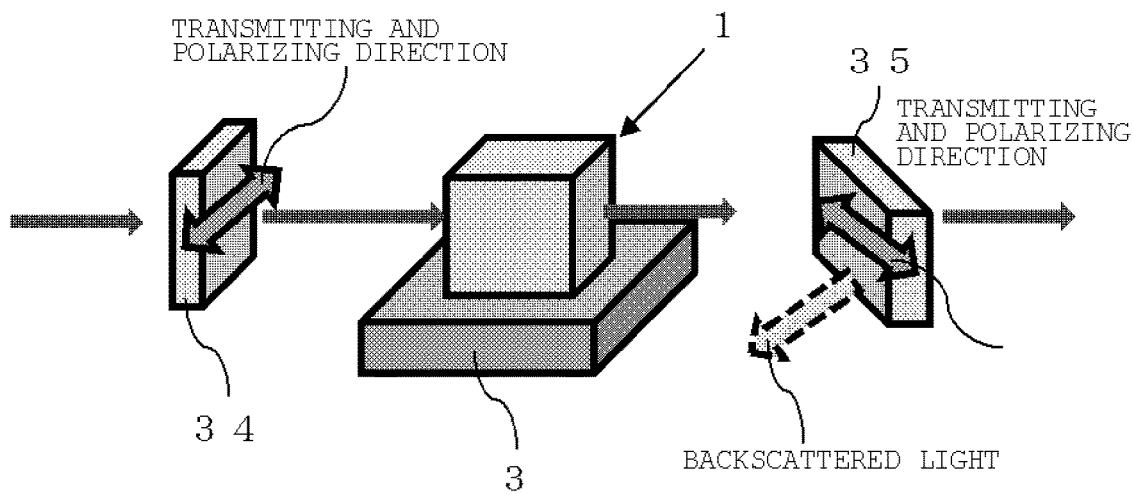
[FIG.5]
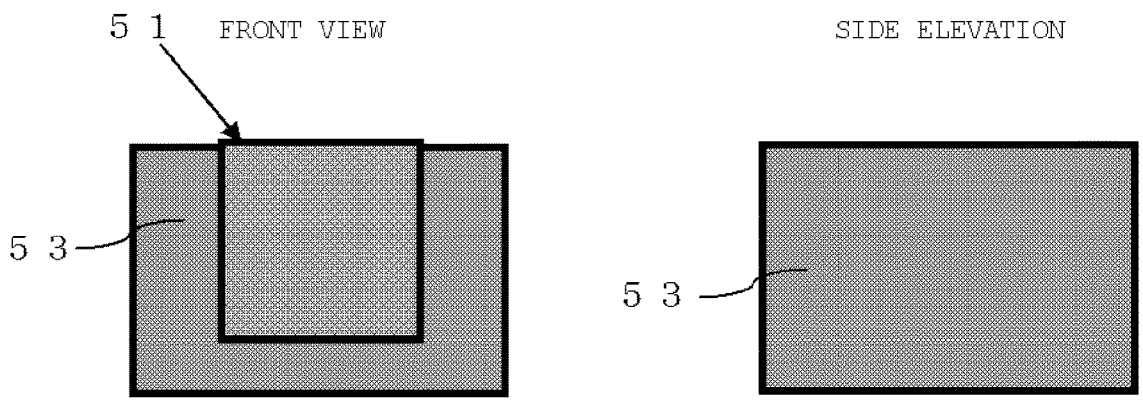

LIGHT GUIDE BODY, OPTICAL MODULE, AND OPTICAL PATH AND OPTICAL AXIS ADJUSTMENT METHOD

TECHNICAL FIELD

The present invention relates to a light guide body, installed in an optical integrated module used in optical communication or optical measurement, and an optical module and an optical path and optical axis measurement method which use this.

BACKGROUND ART

Integration of components in optical modules including Si photonics has been actively performed. Compound semiconductor components (a laser, a modulator, and the like) and waveguide circuit components made of Si (a resonator, a multiplexer, a splitter, and the like) are arranged in each of the optical modules. The compound semiconductor components or Si waveguide circuit components have high polarization dependence, and their characteristics are dependent upon a polarization state of their incident light.

CITATION LIST

Patent Literature

Patent Literature 1: JP2004-347702A

SUMMARY OF INVENTION

Technical Problem

On the other hand, in case of arranging the components in the optical module, optical path and optical axis adjustment is required, and a technique to easily perform the optical path and optical axis adjustment has been demanded (e.g., Patent Literature 1). Although optical waveguide coupling can be performed by adjusting lens alignment or positions of the components, an aligning operation becomes complicated. Further, as described above, since the characteristics of the compound semiconductor components, the Si waveguide circuit components, and the like are dependent on a polarization state of light entering these components, the optical path and optical axis adjustment which does not adversely affect polarization characteristics is required.

In view of the above-described problems, it is an object of the present invention to provide a light guide body which does not adversely affect the polarization characteristics and can easily perform the optical path and optical axis adjustment. Furthermore, another object is to provide an optical module and an optical path and optical axis adjustment method using such a light guide body.

Solution to Problem

To achieve the object, the present invention provides a light guide body for optical path and optical axis adjustment, the light guide body being characterized by including a silicon single crystal having an extinction ratio of 30 dB or more.

Since the silicon single crystal has a high refractive index, an angle at which light is internally propagated and an exit position of the light greatly change, and a position of an optical axis can be easily greatly changed. Furthermore, when an extinction ratio of the silicon single crystal is 30 dB or more, a polarization plane of the light which is transmitted through the silicon single crystal is not considerably disordered. Thus, the light guide body according to the present invention can suppress a change in polarization characteristics and facilitate the optical path and optical axis adjustment.

At this time, it is preferable that one side surface alone of the light guide body is joined and fixed to a base.

With such a structure, strain applied to the light guide body at the time of joining and fixation can be suppressed, and degradation of distinction performance is inhibited.

Moreover, to achieve the object, the present invention provides an optical module including the light guide body installed at an installation angle adjusted for optical path and optical axis adjustment between components.

In such an optical module, since the optical path and optical axis adjustment is performed by the light guide body according to the present invention, polarization characteristics of light are hardly changed by the optical path and optical axis adjustment. Additionally, since the optical path and optical axis adjustment between components such as compound semiconductor components or Si waveguide circuit components can be carried out by a simple technique, the efficiency of designing and manufacturing the optical module can be improved.

Further, to achieve the object, the present invention provides an optical path and optical axis adjustment method including adjusting an installation angle of the light guide body to perform the optical path and optical axis adjustment between components.

According to the optical path and optical axis adjustment method using the light guide body of the present invention, each optical path can be largely changed by simple means, i.e., slightly tilting the light guide body. Furthermore, when the light guide body according to the present invention is used, the polarization characteristics of the light are not considerably disordered.

Advantageous Effects of the Invention

The light guide body according to the present invention can suppress a change in polarization characteristics and then facilitate the optical path and optical axis adjustment. Moreover, according to the optical module using the light guide body of the present invention, the polarization characteristics of the light are hardly changed by the optical path and optical axis adjustment, and the optical path and optical axis adjustment between components can be carried out by a simple technique. Additionally, the optical path and optical axis adjustment using the light guide body of the present invention can suppress a change in polarization characteristics and then facilitate the optical path and optical axis adjustment.

BRIEF DESCRIPTION OF DRAWINGS

FIG. 1 is a front view and a side elevation showing a mode of a light guide body of the present invention whose one side surface alone is joined and fixed to a base;

FIGS. 2A and 2B are schematic views showing a part of a structure in an optical module of the present invention with the light guide body installed away from components A and B (FIG. 2A) and with the light guide body directly joined to at least one of the components (FIG. 2B);

FIG. 3 is a schematic view showing a structure of a measurement system which measures an extinction ratio of the light guide body after joining and fixation;

FIG. 4 is a schematic view showing a structure of a measurement system which measures an insertion loss, an excess loss, and backscattering of the light guide body; and FIG. 5 is a front view and a side elevation showing a mode of a light guide body of the present invention having three side surfaces joined and fixed to a groove of a base.

DESCRIPTION OF EMBODIMENT

An embodiment of the present invention will now be described hereinafter, but the present invention is not restricted thereto.

First, a light guide body according to the present invention will be described. Such a light guide body 1 of the present invention as shown in FIG. 1 is used for optical path and optical axis adjustment. More specifically, the light guide body 1 of the present invention is installed on an optical path in an optical module or the like, and an optical axis of light exiting from the light guide body 1 is shifted from an optical axis of incident light by refracting the light which has entered the light guide body 1, thereby adjusting the optical path and the optical axis.

Further, the light guide body 1 of the present invention is a silicon light guide body made of a silicon single crystal having an extinction ratio of 30 dB or more. Since the silicon single crystal has a high refractive index, an angle at which the light is internally propagated largely varies when the light guide body is slightly tilted, an exit position of the light thereby greatly changes, thus largely shifting an optical axis. Furthermore, when the extinction ratio of the silicon single crystal constituting the light guide body is 30 dB or more, a polarization plane of the light which is transmitted through the silicon single crystal is not considerably disordered. That is, an influence of polarization dependence of circuit components which the light enters after transmission through the light guide body hardly appears, and optical characteristics can be prevented from being degraded. Thus, the light guide body of the present invention can suppress a change in polarization characteristics and then facilitate the optical path and optical axis adjustment.

It is to be noted that a shape of the light guide body made of the silicon single crystal may be appropriately set in accordance with a design of the optical module or the like in which the light guide body is arranged, and it may be a tabular or cubic shape. Additionally, antireflective coating may be applied to the light guide body 1.

Further, the light guide body of the present invention may be joined and fixed to a base which supports the light guide body.

The silicon single crystal having the extinction ratio of 30 dB or more can be obtained as follows, for example. First, a silicon single crystal of a predetermined size is sliced out from a silicon single crystal ingot manufactured by a general silicon single crystal manufacturing method such as a Czochralski method (a CZ method) or a floating zone method (an FZ method). Furthermore, polishing is performed in such a manner that strain to the silicon single crystal can be reduced. Since the distinction ratio of the silicon single crystal is affected by the strain to the silicon single crystal, the extinction ratio of 30 dB or more can be provided by performing the processing so as to reduce the strain.

Moreover, the extinction ratio of the light guide body made of the silicon single crystal is also affected by joining strain to the base which supports the light guide body. Thus, as shown in FIG. 1, it is preferable to join and fix only one side surface of the light guide body 1 of the present invention to the base 3. When the one side surface alone is joined and fixed to the base, joining strain can be minimized and degradation of extinction performance can be suppressed as compared with, e.g., a case where all the circumference is joined and fixed.

It is to be noted that the extinction ratio of the silicon single crystal is a ratio of "intensity $I_{max}$ of linearly polarized light in a polarizing direction of a polarizer" and "intensity $I_{min}$ of linearly polarized light tilted at 90° from the polarizing direction of the polarizer" of the light after transmission of the light from the polarizer through the silicon single crystal, and it can defined as follows when it is converted to decibel:

(Extinction Ratio)=10 log($I_{max}/I_{min}$) (dB)

A description will now be given as to the optical module of the present invention. The optical module of the present invention includes the light guide body 1 of the present invention installed at an installation angle adjusted for the optical path and optical axis adjustment between components A and B. In this manner, the optical module of the present invention can be subjected to the optical path and optical axis adjustment by a simple technique using the light guide body 1 of the present invention.

It is to be noted that the components mentioned here mean compound semiconductor components such as a laser or a modulator or waveguide circuit components such as a resonator, a multiplexer, or a splitter. Additionally, any other component can be used as long as it is a component generally used in a structure of the optical module.

Further, FIG. 2A shows a mode in which the light guide body 1 is installed away from the components A and B, but the present invention is not restricted to this mode alone. Adhesive coating may be applied to one end or both ends of the light guide body of the present invention, and the light guide body may be directly joined to one or both of the components A and B at an angle (a tilt gap is filled with an adhesive, as shown in FIG. 2B.

Further, in case of performing the optical path and optical axis adjustment by the light guide body of the present invention, the light used in the optical module can be particularly preferably used to light having a high transmissivity to the silicon single crystal (i.e., infrared light having a wavelength above a give level).

A description will now be given as to the optical path and optical axis adjustment method of the present invention. According to the optical path and optical axis adjustment method of the present invention, the optical path and optical axis adjustment between components is performed by adjusting an installation angle of the light guide body of the present invention. The between components mentioned here mean a space between components generally used in a structure of the optical module. Such an optical path and optical axis adjustment method enables greatly changing an optical path by simple means, namely, just slightly tilting the light guide body, thereby adjusting the optical path. Further, since the light guide body of the present invention is used, the polarization characteristics of the light are not largely disordered.

EXAMPLES

The present invention will now be more specifically described hereinafter with reference to examples and comparative examples of the present invention, but the present invention is not restricted thereto.

Example 1, Comparative Example 1, Comparative Example 2

An Si single crystal (Example 1), a garnet single crystal ($Gd_3Ga_5O_{12}$) (Comparative Example 1), or a quartz plate ($SiO_2$) (Comparative Example 2) was used as a light guide body, and an optical path change amount (an optical axis shift amount) corresponding to a change in installation angle of each light guide body was measured. First, a double-side AR coat to air (an anti-reflective coat) for a wavelength of 1550 nm was applied to each of the Si single crystal (Example 1), the garnet single crystal ($Gd_3Ga_5O_{12}$) (Comparative Example 1), and the quartz plate ($SiO_2$) (Comparative Example 2) subjected to the double-side polishing to provide a thickness of 1.5 mm, and slicing was performed to provide each chip which is 1.5 mm in height and width, whereby each light guide body was fabricated. At this time, the Si single crystal (a width of 1.5 mm×a height of 1.5 mm×a thickness of 1.5 mm) had an extinction ratio of 42 dB and an insertion loss of 0.02 dB. Furthermore, the respective light guide bodies of Example 1 and Comparative Examples 1 and 2 were tilted at 1 to 10° to incident light having a wavelength of 1550 nm, and an optical path change amount (an optical axis shift amount) corresponding to each tilt angle was measured. Consequently, as can be understood from Table 1, the light guide body using the Si single crystal having a large refractive index was able to provide an extremely larger numerical value of the optical path change amount (the optical axis shift amount) to a change amount of the installation angle than those of the respective light guide bodies using garnet and quartz.

TABLE 1

| Light guide body material/angle (deg) | Optical axis shift amount (μm) | | | | | | |
|---|---|---|---|---|---|---|---|
|  | 1 | 2 | 3 | 4 | 5 | 6 | 10 |
| Example 1 Si single crystal | 19 | 37 | 56 | 74 | 93 | 112 | 188 |
| Comparative Example 1 Garnet ($Gd_3Ga_5O_{12}$) | 13 | 25 | 38 | 50 | 63 | 75 | 126 |
| Comparative Example 2 Quartz ($SiO_2$) | 9 | 18 | 27 | 35 | 44 | 53 | 89 |

Example 2

In general, a polarization optical material or a waveguide type optical component having large polarization dependence is arranged on a rear stage. Thus, in Example 2, an influence of transmitted light transmitted through the light guide body of the present invention on the component was measured under the following conditions. First, the same silicon single crystal as that fabricated in Example 1 was joined and fixed to an SUS304 (stainless steel) plate having a width of 2.0 mm, a height of 0.5 mm, and an optical axial length of 2.0 mm by using an epoxy thermosetting type adhesive, thereby joining and fixing one side surface of such a light guide body 1 made of a silicon single crystal as shown in FIG. 1 to a base 3. Optical characteristics of the silicon single crystal of the light guide body were measured, and then excellent values, i.e., an extinction ratio of 41 dB and an insertion loss of 0.02 dB were provided.

It is to be noted that the extinction ratio of the light guide body after the joining and the fixation was measured by using such a measurement system as shown in FIG. 3. First, as shown in FIG. 3, a polarizer 34 with an extinction ratio of 50 dB and an analyzer 35 both of which have metal particles aligned therein are arranged on front and rear sides of the light guide body 1. Further, an angle of the polarizer 34 was fixed (a transmitting and polarizing direction is fixed), and the analyzer 35 was rotated to measure an extinction ratio.

Then, as shown in FIG. 4, the light transmitted through the polarizer 34 which has the metal particles aligned therein and has extinction performance of 50 dB was allowed to enter the light guide body 1, the analyzer 35 which likewise has metal particles aligned therein and has the extinction performance of 50 dB was arranged on a rear stage to coincide with its transmitting and polarizing direction and to tilt at 8° to an optical axis, and backscattered light from the analyzer 35 was measured.

Table 2 shows an extinction ratio and an insertion loss of each joined and fixed light guide body. Further, each excess loss at the time of transmission through the analyzer and each backscattered light amount from the analyzer are also shown. It is to be noted that the excess loss at the time of transmission through the analyzer is a value excluding an insertion loss of the analyzer. Furthermore, the backscattered light amount is a reflected light amount (a relative value) from the analyzer to an analyzer incident light amount when analyzer incident light amount is 1.

Examples 3 to 5

Each light guide body was fabricated like Example 2 except that an extinction ratio of a silicon single crystal was adjusted to such a value as shown in Table 2, and the same measurement as that in Example 2 was carried out. The extinction ratio of the silicon single crystal of the light guide body was changed by adjusting a joining state of the silicon single crystal to a base and further adjusting joining strain.

Comparative Examples 3 and 4

Each light guide body was fabricated like Example 2 except that an extinction ratio of the light guide body made of a silicon single crystal was adjusted to a value which is less than 30 dB as shown in Table 2, and the same measurement as that in Example 2 was carried out. In each of Comparative Examples 3 and 4, as shown in FIG. 5, three side surfaces of the light guide body 51 made of the silicon single crystal were joined and fixed to a base 53 (an SUS304 component) having a width of 2.0 mm, a height of 2.0 mm, and an optical axis length of 2.0 mm and also having a groove formed with a width of 1.5 mm, a depth of 1.5 mm, and an optical axis direction of 2.0 mm at a central portion thereof by using an epoxy thermosetting type adhesive. As a result of measuring optical characteristics of the light guide body of each of Comparative Examples 3 and 4, an extinction ratio was 24 to 25 dB and varied in a radial direction of a workpiece (the light guide body), and an insertion loss was 0.06 to 0.04 dB, which was higher than those in Examples 2 to 5. It can be considered that such results were obtained due to joining strain. Each extinction ratio was adjusted by adjusting the joining strain in this manner. Table 2 shows the extinction ratio of the joined and fixed light guide body, the insertion loss, an excess loss at the time of transmission through the analyzer, and a backscattered light amount from the analyzer according to each of Comparative Examples 3 and 4.

TABLE 2

| | Si light guide body | | Excess loss in transmission through analyzer (dB) | Backscattered light amount from analyzer (%) |
|---|---|---|---|---|
| | Extinction ratio (dB) | Insertion loss (dB) | | |
| Example 2 | 41 | 0.02 | 0.002 | 0.001 |
| Example 3 | 38 | 0.02 | 0.002 | 0.001 |
| Example 4 | 36 | 0.02 | 0.002 | 0.002 |
| Example 5 | 30 | 0.02 | 0.004 | 0.006 |
| Comparative Example 3 | 25 | 0.04 | 0.017 | 0.030 |
| Comparative Example 4 | 24 | 0.06 | 0.032 | 0.042 |

It was found out that the insertion loss increases when the extinction ratio of each light guide body decreases, and the excess loss largely increases and the backscattered light amount also rises when the extinction ratio is less than 30 dB. It was understood that, to reduce an optical influence on each component arranged on the rear stage of the light guide body, the extinction ratio of the joined and fixed light guide body must be 30 dB or more.

Moreover, when each light guide body fabricated in Examples and Comparative Examples mentioned above was actually inserted between a compound semiconductor component and an Si waveguide circuit component, a variation in polarization dependence characteristics was not observed in each light guide body having a large extinction ratio (30 dB or more), but a variation in polarization dependence characteristics of the waveguide circuit component was observed in each light guide body having a small extinction ratio (less than 30 dB). The compound semiconductor component (e.g., a laser) has polarization properties of 25 dB or more, and inserting the workpiece having the low extinction ratio between the optical paths impaired the polarization properties.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. An optical module comprising:
   components disposed in an optical path of the optical module; and
   a light guide body for optical path and optical axis adjustment, the light guide body being installed between the components and comprising a Czochralski method (CZ) or floating zone method (FZ) silicon single crystal having an extinction ratio of 30 dB or more and a tabular or cubic shape,
   wherein the light guide body is directly joined to at least one of the components, and
   one side surface alone of the light guide body is joined and fixed to a base via an adhesive.

2. The optical module according to claim 1, wherein the light guide body is installed at an installation angle adjusted for optical path and optical axis adjustment between the components.

3. An optical path and optical axis adjustment method comprising adjusting an installation angle of a light guide body in the optical module according to claim 1 to perform the optical path and optical axis adjustment between the components.

4. An optical path and optical axis adjustment method according to claim 3, further comprising filling a tilt gap between the light guide body and the components with the adhesive.

5. An optical path and optical axis adjustment method according to claim 3, further comprising tilting the light guide body so as to shift an optical axis.

* * * * *